US009423464B2

(12) United States Patent
Aoshima et al.

(10) Patent No.: US 9,423,464 B2
(45) Date of Patent: Aug. 23, 2016

(54) BATTERY CONTROL DEVICE

(75) Inventors: Yoshinori Aoshima, Hitachinaka (JP); Keiichiro Ohkawa, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 261 days.

(21) Appl. No.: 14/363,945

(22) PCT Filed: Dec. 9, 2011

(86) PCT No.: PCT/JP2011/078575
§ 371 (c)(1),
(2), (4) Date: Jun. 9, 2014

(87) PCT Pub. No.: WO2013/084353
PCT Pub. Date: Jun. 13, 2013

(65) Prior Publication Data
US 2014/0368206 A1    Dec. 18, 2014

(51) Int. Cl.
*G01N 27/416* (2006.01)
*G01R 31/36* (2006.01)
*H01M 10/48* (2006.01)
*H01M 10/42* (2006.01)

(52) U.S. Cl.
CPC ........ *G01R 31/3606* (2013.01); *G01R 31/3679* (2013.01); *H01M 10/4207* (2013.01); *H01M 10/482* (2013.01); *H01M 10/486* (2013.01); *G01R 31/3658* (2013.01)

(58) Field of Classification Search
CPC .... H02J 7/0021; H02J 7/0026; G01N 27/416; G01R 19/16542; G01R 31/3658; G01R 31/3648

USPC .......... 320/107, 127, 128, 132; 324/426, 427, 324/433, 434
See application file for complete search history.

(56) References Cited

U.S. PATENT DOCUMENTS

2013/0207592 A1*  8/2013  Okada .................. B60L 3/0046
                                                           320/106
2014/0239964 A1*  8/2014  Gach .................... H02J 7/0021
                                                           324/433

FOREIGN PATENT DOCUMENTS

| JP | 03-011937 A | 1/1991 |
| JP | 10-142268 A | 5/1998 |
| JP | 2010-015831 A | 1/2010 |
| WO | 2011/037257 A1 | 3/2011 |

* cited by examiner

*Primary Examiner* — Edward Tso
(74) *Attorney, Agent, or Firm* — Volpe and Koenig, P.C.

(57) ABSTRACT

A battery control device includes an acquisition portion that acquires measured values on the battery state every predetermined period, and a determination processing portion that determines the battery state. The determination processing portion determines that the battery state is abnormal when the number of times the measured value is out of a given range reaches a threshold until the measured value is acquired a predetermined standard number of times. If the number of times the measured value is out of range is less than the threshold when the measured number is acquired the standard number of times, the determination of the battery state is performed for an extended period until the number of times the measured value is out of the range reaches the threshold, or until the measured number is within the range, based on the measured value acquired more than the standard number of times.

5 Claims, 8 Drawing Sheets

FIG. 4

CASE 1

| SAMPLING DATA | ○ | ○ | ○ | ○ | ○ | ○ | ○ |
|---|---|---|---|---|---|---|---|
| SAMPLE COUNT | 1 | 2 | 3 | 4 | 5 | 6 | 7 |
| ABNORMAL COUNT | 0 | 0 | 0 | 0 | 0 | 0 | 0 |
| DETERMINATION | | | | | | | NORMAL |

← 7 SECONDS →

○ WITHIN GIVEN RANGE
× OUT OF GIVEN RANGE

FIG. 6

CASE 3

| SAMPLING DATA | ○ | ○ | ○ | × | × | × | × | × |
|---|---|---|---|---|---|---|---|---|
| SAMPLE COUNT | 1 | 2 | 3 | 4 | 5 | 6 | 7 | 8 |
| ABNORMAL COUNT | 0 | 0 | 0 | 1 | 2 | 3 | 4 | 5 |
| DETERMINATION | | | | | | | | ABNORMAL |

← 5 SECONDS →

FIG. 7
CASE 4
| SAMPLING DATA | ○ | × | ○ | ○ | ○ | × | ○ | × |
|---|---|---|---|---|---|---|---|---|
| SAMPLE COUNT | 1 | 2 | 3 | 4 | 5 | 6 | 7 | 1 |
| ABNORMAL COUNT | 0 | 1 | 1 | 1 | 1 | 2 | 2 | 1 |
| DETERMINATION | | | | | | | NORMAL | |
7 SECONDS

CASE 5

| SAMPLING DATA | ○ | ○ | × | × | ○ | × | × | × |
|---|---|---|---|---|---|---|---|---|
| SAMPLE COUNT | 1 | 2 | 3 | 4 | 5 | 6 | 7 | 8 |
| ABNORMAL COUNT | 0 | 0 | 1 | 2 | 2 | 3 | 4 | 5 |
| DETERMINATION | | | | | | | | ABNORMAL |

← 6 SECONDS →

BATTERY CONTROL DEVICE

TECHNICAL FIELD

The present invention relates to a battery control device.

BACKGROUND ART

Conventionally, batteries such as a nickel-hydrogen storage battery and a lithium-ion storage battery have been used as power supply source to drive electric and hybrid vehicles. A vehicle with these batteries includes a battery control device to monitor and control the batteries. When an abnormality occurs in the state of the battery, it is necessary to properly detect the abnormality by the battery control device to secure the safety and the like.

The abnormality determination method described in Patent Literature 1 is known as a technique for detecting battery abnormality. The abnormality determination method is configured to sample the voltage between the terminals of the battery every predetermined period, and determine to be abnormal if the difference from the sampling value one period before is out of a given range.

CITATION LIST

Patent Literature

Patent Literature 1: Japanese Unexamined Patent Application Publication No. 2010-15831

SUMMARY OF INVENTION

Technical Problem

In general in the state of the battery, abnormality occurs due to the following two factors: one is persistent factors such as a failure, and the other is temporary factors such as the influence of noise. In the former case, it is necessary to reliably determine the abnormality of the battery. While in the latter case, the problem can be naturally solved and the battery can return to normal. However, in the abnormality determination method described in Patent Literature 1, it is difficult to perform a proper determination by identifying the difference between these abnormalities.

The present invention has been made in view of the above problem, and an object thereof is to provide a battery control device that can properly determine the abnormality of the state of the battery.

Solution to Problem

A battery control device according to a first aspect of the present invention includes: an acquisition portion that acquires a measured value on the state of a battery every predetermined period; and a determination processing portion that determines whether the measured value is within a given range, to determine whether the state of the battery is normal or abnormal based on the determination result. In such a battery control device, if the number of times the measured value is determined to be out of the range reaches a predetermined threshold until the acquisition portion acquires the measured value the predetermined standard number of times, the determination processing portion determines that the state of the battery is abnormal. Further, if the number of times the measured value is determined to be out of the range is less than the threshold when the acquisition portion acquires the measured value the standard number of times, the determination of whether the state of the battery is normal or abnormal is performed for an extended period of time, until the number of times the measured value is determined to be out of the range reaches the threshold, or until the measured value is determined to be within the range.

According to a second aspect of the present invention, the battery control device according to the first aspect may also further include a storage portion that stores a first counter to be incremented by the number of times the acquisition portion acquired the measured value, and a second counter to be incremented by the number of times the determination processing portion determined that the measured value is out of the range. In such a battery control device, if it is determined that the measured value is within the range, the determination processing portion determines whether the first counter is not less than the standard number of times. Then, if the first counter is not less than the standard number of times, it is desirable to determine that the state of the battery is normal. Further, if it is determined that the measured value is out of the range, the determination processing portion determines whether the second counter is not less than a threshold. If the second counter is not less than the threshold, it is desirable to determine that the state of the battery is abnormal.

According to a third aspect of the present invention, in the battery control device according to the first or second aspect, it is preferable that the standard number of times is greater than the threshold.

According to a fourth aspect of the present invention, in the battery control device according to one of the first to third aspects, any of plural operation modes can be configured on the determination processing portion. At least one of the standard number of times and the threshold may be changed according to the operation mode configured on the determination processing portion.

According to a fifth aspect of the present invention, in the battery control device according to one of the first to fourth aspects, the acquisition portion acquires at least the temperature of the battery as the measured value. Then, at least either of the standard number of times and the threshold may be changed according to the temperature of the battery.

Advantageous Effects of Invention

With the battery control device according to the present invention, it is possible to properly determine the abnormality of the state of the battery.

BRIEF DESCRIPTION OF DRAWINGS

FIG. 4 is a view of Case 1, showing a specific example of the abnormality determination;

FIG. 6 is a view of Case 3, showing a specific example of the abnormality determination;

FIG. 7 is a view of Case 4, showing a specific example of the abnormality determination.

DESCRIPTION OF EMBODIMENTS

Hereinafter, an embodiment of the present invention will be described with reference to the accompanying drawings. The embodiment described below can be applied to a battery system forming a power source, for example, on electric vehicle (EV), hybrid vehicle (HEV), and plug-in-hybrid vehicle (PHEV).

In the battery system described in the embodiment below, for example, a lithium ion battery can be used. Other batteries such as nickel hydroid battery, lead acid battery, electric double layer capacitor, and hybrid capacitor can also be used. Note that in the embodiment described below, a assembly battery is formed by connecting battery cells in series. However, it is also possible to form a assembly battery by connecting parallel-connected battery cells in series or by connecting serial-connected battery cells in parallel.

Figure 1:
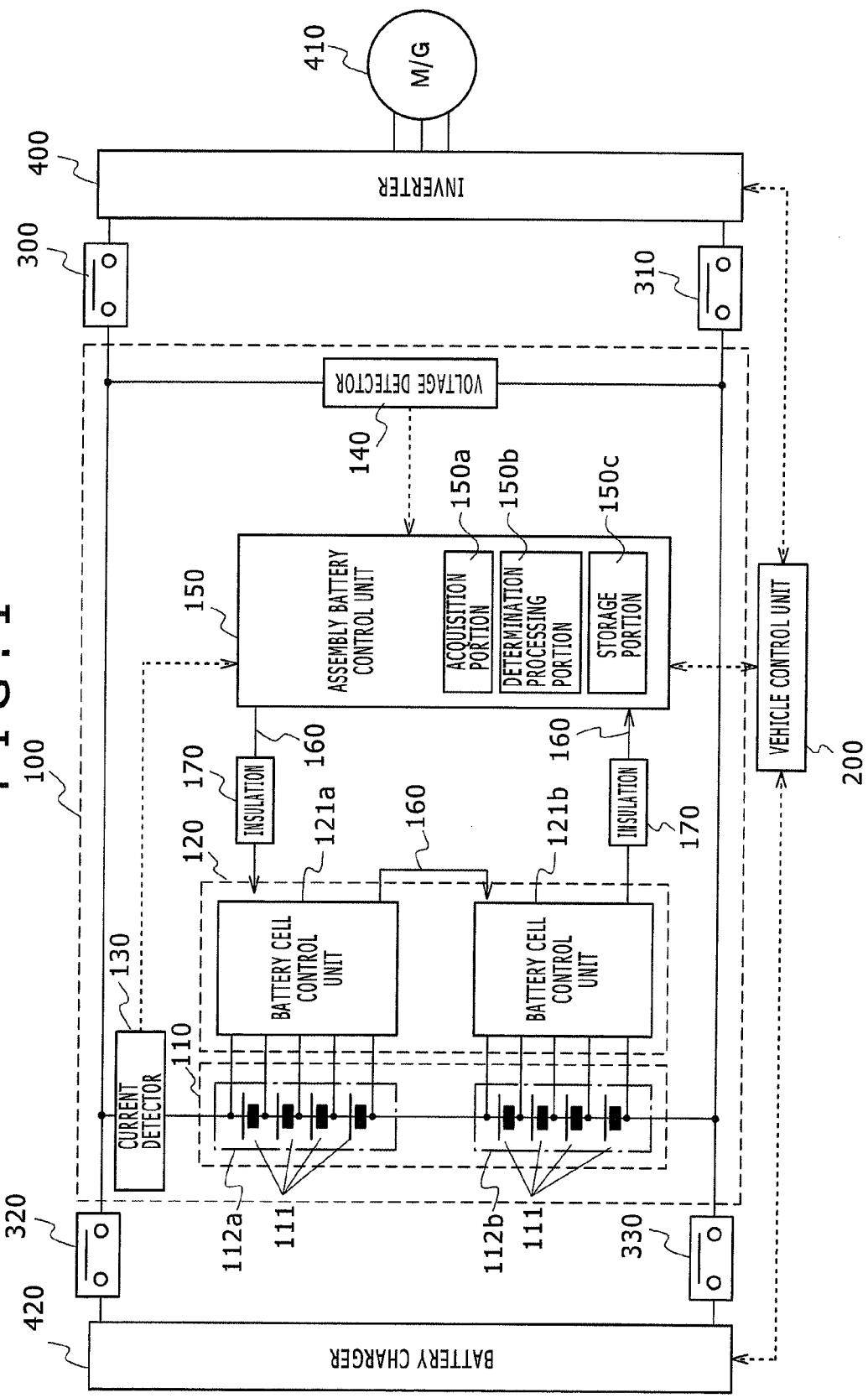
FIG. 1 is a block diagram of the configuration of a battery system and its periphery according to an embodiment to which a battery control device according to the present invention is applied.

FIG. 1 is a block diagram of the configuration of a battery system 100 and its periphery, according to an embodiment of the present invention. The battery system 100 is connected to an inverter 400 through relays 300 and 310, and connected to a battery charger 420 through relays 320 and 330. The battery system 100 includes a assembly battery 110, a battery cell management device 120, a current detector 130, a voltage detector 140, a assembly battery control unit 150, and a storage part 150c.

The assembly battery 110 is formed by plural battery cells 111. The battery cell management device 120 monitors the state of the battery cells 111 by detecting the battery voltage and temperature of each battery cell 111. Then, the battery cell management device 120 outputs the result to the assembly battery control unit 150. The current detector 130 detects the charge and discharge current flowing through the battery system 100, and outputs the detected current value to the assembly battery control unit 150. The voltage detector 140 detects the total voltage of the assembly battery 110 and outputs the detected voltage value to the assembly battery control unit 150. The assembly battery control unit 150 controls the assembly battery 110.

The assembly battery control unit 150 is realized, for example, by a microcomputer and a memory, with the functions of an acquisition portion 150a, a determination processing portion 150b, and a storage portion 150c.

The acquisition portion 150a acquires information of the measurement results on the state of the assembly battery 110 described above, from the battery cell management device 120, the current detector 130, and the voltage detector 140, respectively. In other words, the acquisition portion 150a receives the information on the battery voltage and temperature of each signal cell 111 that is transmitted from the battery cell management device 120, the information on the charge and discharge current transmitted by the current detector 130, and the information on the total voltage of the assembly battery 110 that is transmitted from the voltage detector 140. Note that in the following description, the information of the measurement results on the state of the assembly battery 110, which is acquired by the assembly battery control unit 150, is collectively referred to as the battery measurement information.

The determination processing portion 150b detects the state of the assembly battery 110 based on the battery measurement information acquired by the acquisition portion 150a as described above. At this time, the determination processing portion 150b calculates the state of charge (SOC), the state of health (SOH), and the like of each of the battery cells 111 forming the assembly battery 110, and determines whether the state of the assembly battery 110 is normal or abnormal. Note that the method for determining whether the state of the assembly battery 110 is normal or abnormal will be described in detail below. The state detection results by the determination processing portion 150b on the assembly battery 110 are transmitted from the assembly battery control unit 150 to the battery cell management device 120 as well as a vehicle control unit 200.

The storage portion 150c stores various information used by the determination processing portion 150b to perform the determination. The information stored in the storage portion 150c is read and rewritten, if necessary, under the control of the determination processing portion 150b.

Plural battery cells 111 capable of accumulating and discharging electric energy (charging and discharging DC power) are electrically connected in series to form the assembly battery 110. The battery cells 111 forming the battery pack 110 are divided into groups by a predetermined number of units. The state management and control is performed by the battery cell management device 120 for each of the groups. The battery cells 111 of each group are electrically connected in series to form battery cell groups 112a and 112b. The number of battery cells 111 forming the battery cell groups 112a and 112b can be the same or may be different in the battery cell groups 112a and 112b.

The battery cell management device 120 monitors the state of the battery cells 111 forming the assembly battery 110. The battery cell management device 120 includes battery cell control units 121a and 121b corresponding to the battery cell groups 112a and 112b, respectively. The battery cell control units 121a and 121b monitor and control the state of each of the battery cells 111 forming the battery cell groups 112a and 112b, respectively.

Note that in the present embodiment, in order to simplify the explanation, four battery cells 111 are electrically connected in series to form the battery cell groups 112a and 112b, and the battery cell groups 112a and 112b are also electrically connected in series to form the assembly battery 110 with eight battery cells 111 in total. However, the number of battery cell groups and battery cells forming the assembly battery 110 is not limited to the exemplary embodiment.

The assembly battery control unit 150 and the battery cell management device 120 transmit and receive signals to and from each other, through an insulating element 170 and a signal communication means 160 that are represented by the photocoupler.

Here, communication between the battery cell control units 121a and 121b forming the battery cell management device 120 will be described. The battery cell control units 121a and 121b are connected in series from the highest potential of the battery cell groups 112a and 112b to be monitored by the battery cell control units 121a and 121b, respectively. A signal transmitted by the assembly battery control unit 150 to the battery cell management device 120 is input to the battery cell control unit 121a, through the signal communication means 160 and the insulating element 170. The output of the battery cell control unit 121a is input to the battery cell control unit 121b through the signal communication means 160. Then, the output of the bottom battery cell control unit 121b is transmitted to the assembly battery control unit 150, through the insulating element 170 and the signal communication means 160. In the present embodiment, the communication between the battery cell control units 121a and 121b is made not through the insulating element 170. However, it is also possible to transmit and receive signals through the insulating element 170.

The vehicle control unit 200 controls the inverter 400 connected to the battery system 100 through the relays 300 and 310, based on the information transmitted by the assembly battery control unit 150. Further, the vehicle control unit 200 controls the battery charger 420 connected to the battery system 100 through the relays 320 and 330.

The battery charger 420 is used for charging the assembly battery 110 by using a charging facility provided in the power supply of a home or public facility. In the present embodiment, the battery charger 420 is designed to control the charging voltage and current based on a command from the vehicle control unit 200. However, the battery charger 420 may control the charging voltage and current based on a command from the assembly battery control unit 150. Further, the battery charger 420 can be provided inside or outside the vehicle.

When the vehicle with the battery system 100 runs, the battery system 100 is connected to the inverter 400 through the relays 300, 310 under the supervision of the vehicle control unit 200. At this time, a motor generator 410 is driven by the control of the inverter 400 by using the energy accumulated in the assembly battery 110. Further, the assembly battery 110 is charged by the power generated by the motor generator 410 upon regeneration.

While when the vehicle with the battery system 100 is connected to the charging equipment provided in the power supply of a home or public facility, the battery system 100 is connected to the battery charger 420 through the relays 320 and 330 based on the information transmitted by the vehicle control unit 200. At this time, the assembly battery 110 is charged to reach a predetermined condition. The energy charged and accumulated in the assembly battery 110 is used for the next vehicle running as well as the operation of the electric components inside and outside the vehicle. Further, the energy may be discharged to an external power supply represented by the home power supply, if necessary.

Figure 2:
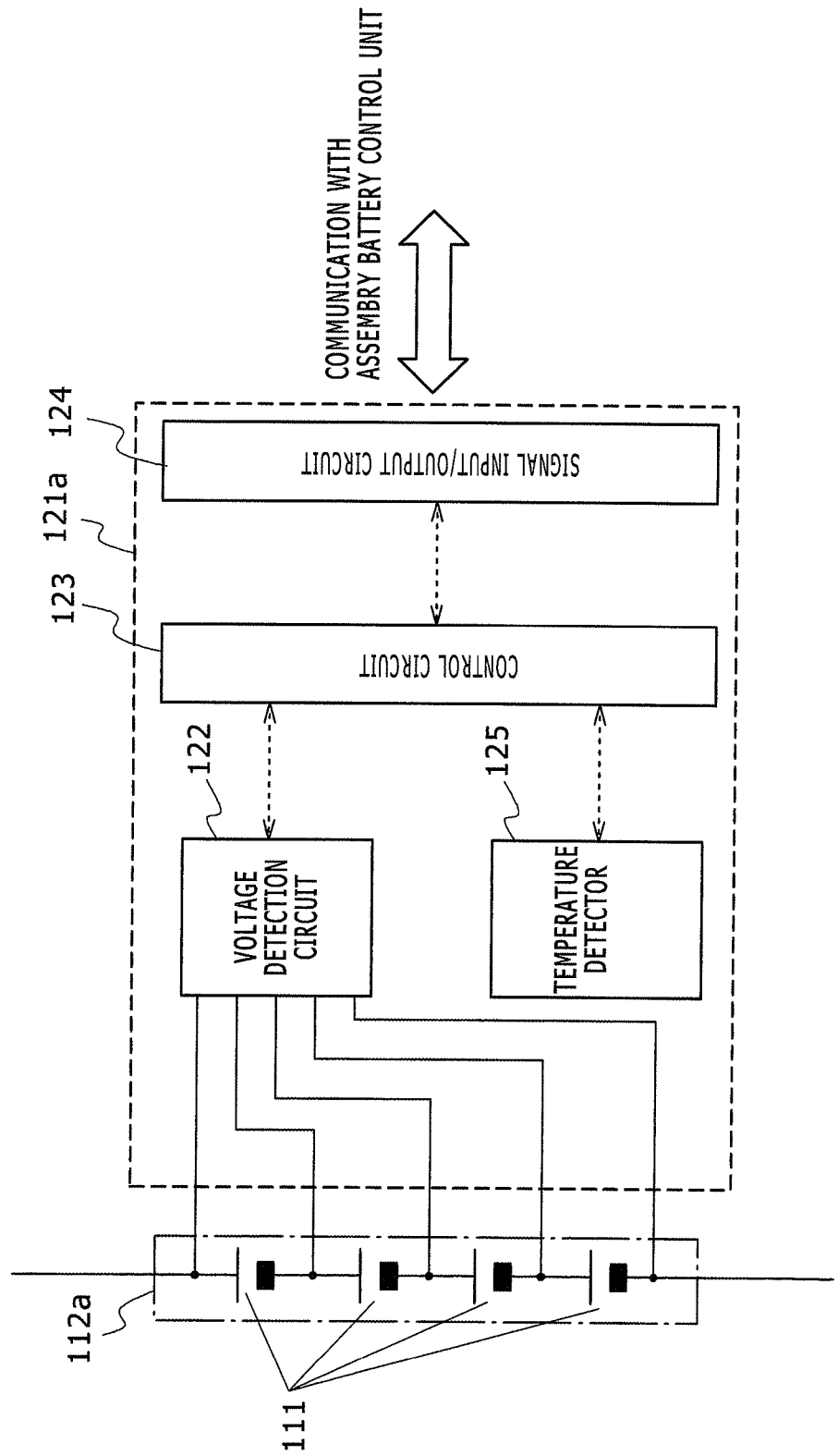
FIG. 2 is a block diagram showing the circuit configuration of a battery cell control part.

FIG. 2 is a block diagram showing the circuit configuration of the battery cell control unit 121*a*. Note that the battery cell control unit 121*a* and the battery cell control unit 121*b* basically have the same circuit configuration. Thus, the battery cell control unit 121*a* is described below as a representative example.

The battery cell control unit 121*a* includes a voltage detection circuit 122, a control circuit 123, a signal input/output circuit 124, and a temperature detector 125. Note that, although omitted in FIG. 2, the known balancing circuit or other circuits can also be provided in the battery cell control unit 121*a* to equalize the fluctuations in the battery voltage and SOC between the battery cells 111.

The voltage detection circuit 122 measures the battery voltage of each battery cell 111 by measuring the voltage between the terminals of the respective battery cells 111. The temperature detector 125 measures the entire battery cell group 112*a*, which is treated as the temperature of each of the battery cells 111 forming the battery cell group 112*a*. Thus, the temperature detector 125 measures the temperature of each battery cell 111. The control circuit 123 receives the measurement results from the voltage detection circuit 122 and the temperature detector 125, respectively, and transmits to the assembly battery control unit 150 through the signal input/output circuit 124.

A temperature sensor is provided in the battery cell group 112*a* in which the temperature is to be measured. The temperature detector 125 detects the voltage corresponding to the temperature of the battery cell group 112*a* that is output from the temperature sensor. Thus, the temperature detector 125 measures the temperature of the battery cell group 112*a*, namely, the temperature of each battery cell 111. The measurement results are transmitted from the temperature detector 125 to the signal input/output circuit 124 through the control circuit 123, and output from the signal input/output circuit 124 to the outside of the battery cell control unit 121*a*. The circuit for achieving a series of these flows is implemented in the battery cell control unit 121*a* as the temperature detector 125. Note that when it is designed that the voltage detection circuit 122 measures the voltage output from the temperature sensor as the temperature information of the battery cell group 112*a*, the temperature detector 125 can be omitted.

Further, the temperature detector 125 may be provided for each battery cell 111 to separately measure the temperature of each battery cell 111 to be able to perform various calculations based on the measurement results by the assembly battery control unit 150. In this case, the configuration of the battery cell control unit 121*a* is complicated due to the increase in the number of temperature detectors 125, compared to the case of measuring the temperature of the entire battery cell group 112*a* as the temperature of each battery cell 111.

Figure 3:
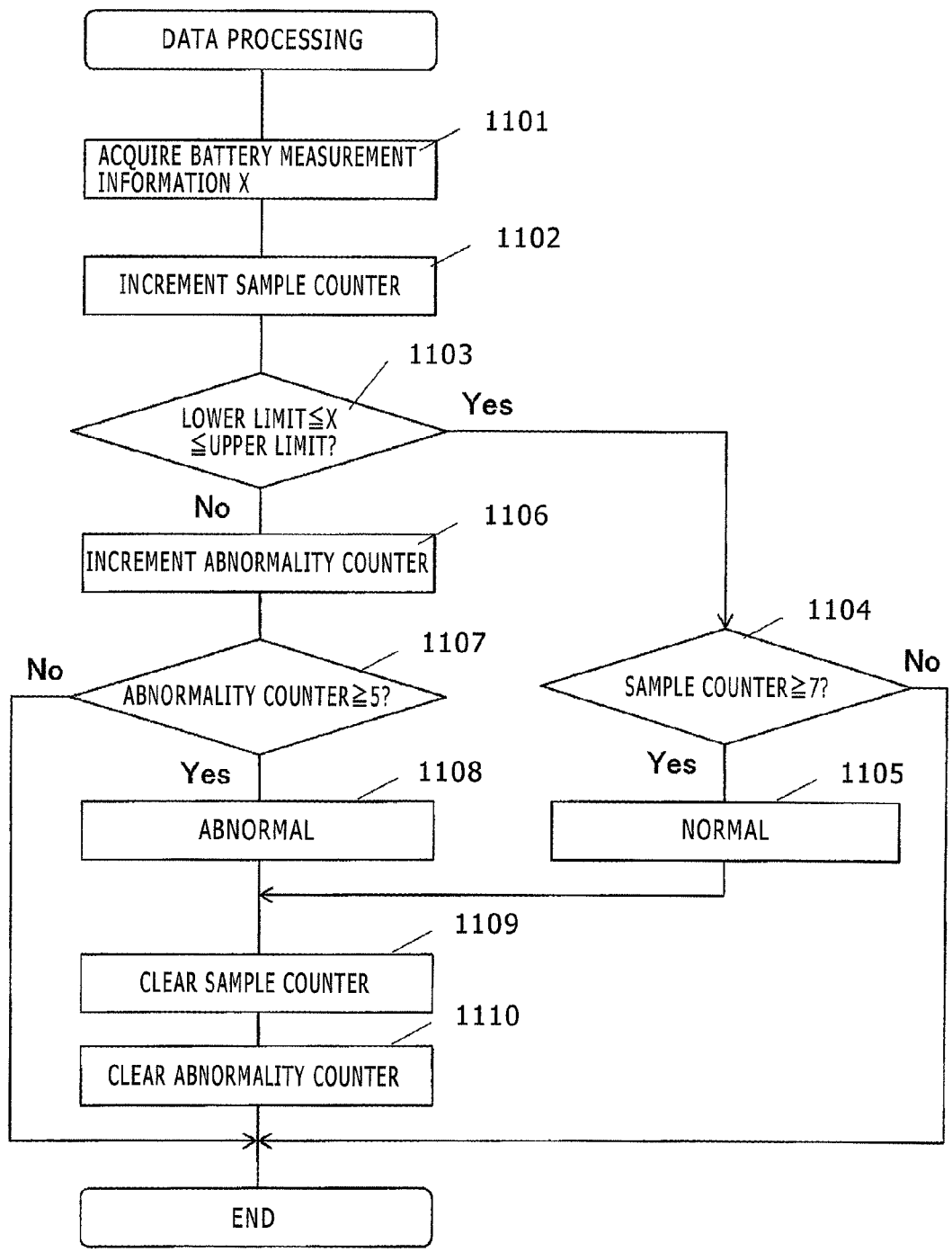
FIG. 3 is a flowchart showing the procedure of an abnormality determination process.

The next describes the abnormality determination of the assembly battery 110 by the assembly battery control unit 150 in the battery system 100 with the configuration described above. As described above, the assembly battery control unit 150 determines whether the state of the assembly battery 110 is normal or abnormal, based on the battery measurement information transmitted from the battery cell management device 120, the current detector 130, and the voltage detector 140. FIG. 3 is a flow chart showing the procedure of the abnormality determination process performed by the assembly battery control unit 150 at this time every predetermined period.

The assembly battery control unit 150 acquires the battery measurement information from the battery cell management device 120, the current detector 130, and the voltage detector 140, by the acquisition portion 150*a* in step 1101. Here, the acquired battery measurement information will be referred to as the battery measurement information X in the following description.

In step 1102, the assembly battery control unit 150 increments by one the sample counter stored in the storage portion 150*c*, by the determination processing portion 150*b*. The sample counter is incremented by one according to the number of times the acquisition portion 150*a* acquired the battery measurement information in step 1101. The initial value is 0.

In step 1103, the assembly battery control unit 150 determines whether the battery measurement information X acquired in step 1101 is within a given normal range by the determination processing portion 150*b*. Here, it is determined whether each of the measurement values of the assembly battery 110 that are represented by the battery measurement information X, namely, each of the battery voltage, the temperature, the charge and discharge current, and the total voltage, is between the lower and upper limits set for each value individually. As a result, if all the measurement values are between the lower and upper limits, the assembly battery control unit 150 determines that the battery measurement information X is within the normal range, and proceeds to step 1104. On the other hand, if at least one of the measurement values is less than the lower limit or more than the upper limit, the assembly battery control unit 150 determines that the battery measurement information X is out of the normal range and proceeds to step 1106.

When proceeding to step 1104, the assembly battery control unit 150 determines whether the value of the sample counter is not less than a predetermined standard number of times (here, 7) by using the determination processing portion 150*b* in step 1104. If the value of the sample counter is 7 or greater, the assembly battery control unit 150 proceeds to step 1105. On the other hand, if the value of the sample counter is less than 7, the assembly battery control unit 150 once ends the flow chart of FIG. 3, and starts again the process from step 1101 after waiting for the next processing timing.

In step 1105, the assembly battery control unit 150 determines that the state of the assembly battery 110 is normal by the determination processing portion 150*b*. This determination result is transmitted to the vehicle control unit 200 from the assembly battery control unit 150 immediately or at a predetermined timing. After performing step 1105, the assembly battery control unit 150 proceeds to step 1109.

When proceeding to step 1106, the assembly battery control unit 150 increments the value of an abnormality counter stored in the storage portion 150*c* by one, by using the determination processing portion 150*b* in step 1106. The abnormality counter is incremented by one according to the number of times the battery measurement information X is determined to be out of the normal range in step 1103. The initial value is 0.

In step 1107, the assembly battery control unit 150 determines whether the value of the abnormality counter is not less than a predetermined threshold (here, 5) by the determination processing portion 150*b*. If the value of the abnormality counter is not less than 5, the assembly battery control unit 150 proceeds to step 1108. On the other hand, if the value of the abnormality counter is less than 5, the assembly battery control unit 150 once ends the flow chart of FIG. 3, and starts again the process from step 1101 after waiting for the next processing timing.

In step 1108, the assembly battery control unit 150 determines that the state of the assembly battery 110 is abnormal by using the determination processing portion 150*b*. This determination result is transmitted to the vehicle control unit 200 from the assembly battery control unit 150 immediately or at a predetermined timing.

In step 1109, the assembly battery control unit 150 clears the value of the sample counter stored in the storage portion 150*c* to the initial value 0, by the determination processing portion 150*b*.

In step 1110, the assembly battery control unit 150 clears the value of the abnormality counter stored in the storage portion 150*c* to the initial value 0, by the determination processing portion 150*b*. After performing step 1110, the assembly battery control unit 150 ends the flow chart of FIG. 3.

The above process is repeatedly performed by the assembly battery control unit 150 every predetermined period. In this case, if the number of times the acquired battery measurement information is determined to be out of the normal range in step 1103 reaches 5 until the battery measurement information is acquired seven times, it is determined that the state of the assembly battery 110 is abnormal. On the other hand, if the number of times the obtained battery measurement information is determined to be out of the normal range in step 1103 is less than 5 when the battery measurement information is acquired seven times, the determination of whether the state of the assembly battery 110 is normal or abnormal is not made and the acquisition of the battery measurement information is continued. Then, the determination of whether the state of the assembly battery 110 is normal or abnormal is performed for an extended period of time, until the number of times the acquired battery measurement information is determined to be out of the normal range reaches 5, or until the acquired battery measurement information is determined to be within the normal range.

Note that in the process described above, it is determined whether each of the measured values represented by the acquired battery measurement information is within the normal range in step 1103. However, it is also possible to perform the process shown in the flow chart of FIG. 3 with respect to each measurement value.

A specific example of the abnormality determination by the procedure shown in FIG. 3 will be described according to Cases 1 to 5 shown in FIGS. 4 to 8, respectively. Note that the sampling interval for acquiring the battery measurement information as the sampling data is set to one second in each case. Further, similar to the configuration shown in FIG. 3, the standard number of times in the sampling counter used in the determination of step 1104 is set to 7, and the threshold of the abnormality counter used in the determination of step 1107 is set to 5.

FIG. 4 shows Case 1, in which the battery measurement information acquired as the sampling data is all within the normal range. In this case, the sample counter is counted up by one every second, and when the seventh sampling data is acquired, namely, seven seconds later, it is determined that the state of the assembly battery 110 is normal.

Figure 5:
FIG. 5 is a view of Case 2, showing a specific example of the abnormality determination.

FIG. 5 shows Case 2, in which the battery measurement information acquired as the sampling data is all out of the normal range. In this case, the sampling counter and the abnormality counter are counted up by one every second, and when the fifth sampling data is acquired, namely, five seconds later, it is determined that the state of the assembly battery 110 is abnormal.

FIG. 6 shows Case 3, in which the battery measurement information acquired as the sampling data s within the normal range until three times, but is consecutively out of the normal range from four times (four seconds later). In this case, the battery measurement information acquired as the sampling data is out of the normal range when the count value of the sampling counter reaches 7 which is the standard number of times. Thus, the determination is negative in step 1103 in the process flow of FIG. 3, so that the abnormality counter is counted up in step 1106, instead of performing step 1104. However, at this time, the counter value of the abnormality counter is 4, namely, less than the threshold 5. Thus, the determination is negative in step 1107 and the process flow once ends. Then, the process is in a waiting state until the next sampling data is acquired.

After that, also the battery measurement information acquired as the eighth sampling data is out of the normal range, so that step 1106 is performed and the abnormality counter is counted up. As a result, the counter value of the abnormality counter reaches 5. Then, after the determination is affirmative in step 1107, step 1108 is performed to determine that the state of the assembly battery 110 is abnormal.

In Case 3 described above, abnormal data is output after the acquisition of the third sampling data. This abnormality can be detected by five seconds at the latest after the abnormality occurred in the state of the assembly battery 110. In this way, even if the state of the assembly battery 110 is abnormal from the middle, it is possible to detect abnormality with the same speed as in Case 2 in which the state of the assembly battery 110 is abnormal from the beginning.

FIG. 7 shows Case 4, in which the battery measurement information acquired as the sampling data is intermittently out of the normal range in only two of seven times. In this case, the abnormality counter is counted up twice until the count value of the sample counter reaches 7. However, the threshold of the counter value is less than 5, so that the determination is negative in step 1107. Thus, the state of the assembly battery 110 is not determined to be abnormal in step 1108 during this period of time.

Then, when the count value of the sample counter reaches 7, the battery measurement information within the normal range is acquired as the sampling data. Thus, the determination is affirmative in step 1103 in the process flow of FIG. 3, and the process proceeds to step 1104. As a result, after the determination is affirmative in step 1104, step 1105 is performed to determine that the state of the assembly battery 110 is normal.

In Case 4 described above, although the sampling data out of the normal range is temporarily output, it is possible to determine that the state of the assembly battery 110 is normal seven seconds later. In this way, when the battery measurement information, which is not normal due to the influence of noise and the like, is temporarily output, it is possible to determine that the state of the assembly battery 110 is normal with the same speed as in Case 1 in which the battery measurement information is all normal, without a wrong judgment.

Figure 8:
FIG. 8 is a view of Case 5, showing a specific example of the abnormality determination.

FIG. 8 shows Case 5, in which the battery measurement information acquired as the sampling data is out of the normal range from the third time (three seconds later) due to factors such as a failure, and temporarily within the normal range due to the influence of noise and the likes in the fifth time. Also in this case, similar to Case 3 described above, the value of the abnormality counter is less than the threshold 5 when the battery measurement information out of the normal range is acquired as the seventh sampling data. Thus, at this time, whether the state of the assembly battery 110 is normal or abnormal is not determined and the next eighth sampling data is acquired. As a result, it is determined that the state of the assembly battery 110 is abnormal.

In Case 5 described above, although the sampling data within the normal range is temporarily output, it is possible to determine that the state of the assembly battery 110 is abnormal. In this way, even if the normal battery measurement information is temporarily output although the state of the assembly battery 110 is abnormal due to the influence of noise and the like, it is possible to determine that the state of the assembly battery 110 is abnormal, without a wrong judgment.

According to the embodiment described above, the following effects are achieved.

(1) The assembly battery control unit 150 acquires battery measurement information representing the measured values on the state of the assembly battery 110 every predetermined period by the acquisition portion 150*a* (step 1101). Then, the assembly battery control unit 150 determines whether the acquired battery measurement information is within a given normal range by the determination processing portion 150*b* (step 1103). Then, the determination processing portion 150*b* determines whether the state of the assembly battery 110 is normal or abnormal based on the determination result (steps 1105, 1108). In other words, the determination processing portion 150*b* determines that the state of the assembly battery 110 is abnormal in step 1108 when the number of times the battery measurement information is determined to be out of the normal range in step 1103 reaches a predetermined threshold, until the acquisition portion 150*a* acquires the battery measurement information a predetermined standard number of times in step 1101. On the other hand, when the acquisition portion 150*a* acquires the battery measurement information the standard number of times in step 1101, and if the number of times the battery measurement information is determined to be out of the normal range is less than the threshold, the determination processing portion 150*b* perform neither of steps 1105 and 1108 and starts again the process after waiting for the next processing timing. In this way, the determination of whether the state of the assembly battery 110 is normal or abnormal is performed for an extended period of time, until the number of times the battery measurement information is determined to be out of the normal range in step 1103 reaches the threshold, or until the battery measurement information is determined to be within the normal range in step 1103, based on the battery measurement information acquired by the acquisition portion 150*a* more than the standard number of times. With this configuration, it is possible to properly determine the abnormality of the state of the assembly battery 110 by the assembly battery control unit 150.

(2) The assembly battery control unit 150 stores the sample counter incremented in step 1102 according to the number of times the acquisition portion 150*a* acquired the battery measurement information, as well as the abnormality counter incremented in step 1106 according to the number of times the determination processing portion 150*b* determines that the battery measurement information is out of the normal range, by using the storage portion 150*c*. If it is determined that the battery measurement information is within the normal range in step 1103, the determination processing portion 150*b* determines whether the sample counter is not less than the standard number of times (step 1104). As a result, if the sample counter is not less than the standard number of times, the determination processing portion 150*b* determines that the state of the assembly battery 110 is normal in step 1105. On the other hand, if it is determined that the battery measurement information is out of the normal range in step 1103, the determination processing portion 150*b* determines whether the abnormality counter is not less than the threshold (step 1107). As a result, if the abnormality counter is not less than the threshold, the determination processing portion 150*b* determines that the state of the assembly battery 110 is abnormal in step 1108. With this configuration, it is possible to reliably determine whether the state of the assembly battery 110 is normal or abnormal from the determination result of step 1103.

It should be understood that the present invention is not limited to the above exemplary embodiment and various changes and modifications can be made without departing from the scope of the present invention. For example, in the above exemplary embodiment, the standard number of times in the sample counter used in the determination of step 1104 is set to 7, and the threshold of the abnormality counter used in the determination of step 1107 is set to 5. However, other values may be used. Any value may be set, as long as it satisfies the condition that the standard number of times for the sample counter is greater than the threshold for the abnormality counter.

Further, at least one of the standard number of times in the sample counter and the threshold of the abnormality counter may be changed according to the condition. For example, one of plural predetermined operation modes can be configured on the assembly battery control unit 150, allowing the values to be changed according to the configured operation mode. In this case, it is desirable that the configuration of the operation mode on the assembly battery control unit 150 is performed according to the magnitude of the predicted noise or other factors. For example, the operation mode can be configured according to the ignition state of the vehicle, the operation state of the inverter 400 and the motor generator 410, the occurrence of communication errors, and the like. Further, it is also possible to change at least one of the standard number of times in the sample counter and the threshold of the abnormality counter, according to the temperature of the assembly battery 110 represented by the acquired battery measurement information.

In the embodiment described above, it is assumed that the information of the battery voltage and temperature of each battery cell 111, the information of the charge and discharge current, and the information of the total voltage of the assembly battery 110 are acquired as the battery measurement information to determine whether the assembly battery 110 is normal or abnormal based on the acquired information. However, the present invention is not limited to the exemplary embodiment. For example, the acquisition of any of these pieces of information may be omitted, or other information may also be acquired. In other words, any information may be acquired as the battery measurement information as long as the information represents the measurement result on the states of the assembly battery 110.

The variations described above may be applied independently or in any combination.

The embodiment and variations described above are merely examples, and the present invention is not limited to these contents as long as they do not impair the features of the present invention.

The invention claimed is:

1. A battery control device comprising:
   an acquisition portion that acquires a measured value of the state of a battery every predetermined period; and
   a determination processing portion that determines whether the measured value is within a given range to determine whether the state of the battery is normal or abnormal based on the determination result,
   wherein the determination processing portion determines that the state of the battery is abnormal when the number of times the measured value is determined to be out of the given range reaches a predetermined threshold until the acquisition portion acquires the measured value a predetermined standard number of times,
   wherein if the number of times the measured value is determined to be out of the given range is less than the threshold when the acquisition portion acquires the measured value the standard number of times, the determination processing portion performs the determination whether the state of the battery is normal or abnormal for an extended period, until the number of times the measured value is determined to be out of the range reaches the threshold, or until the measured value is determined to be within the range, based on the measured value acquired by the acquisition portion more than the standard number of times.

2. A battery control device according to claim 1, further comprising:
   a storage portion that stores a first counter to be incremented according to the number of times the acquisition portion has acquired the measured value, and a second counter to be incremented according to the number of times the determination processing portion has determined that the measured value is out of the given range,
   wherein if it is determined that the measured value is within the given range, the determination processing portion determines whether the first counter is not less than the standard number of times, and determines that the state of the battery is normal if the first counter is not less than the standard number of times, and
   wherein if it is determined that the measured value is out of the given range, the determination processing portion determines whether the second counter is not less than the threshold, and determines that the state of the battery is abnormal if the second counter is not less than the threshold.

3. A battery control device according to claim 1,
   wherein the standard number of times is greater than the threshold.

4. A battery control device according to claim 1,
   wherein any of a plurality of operation modes can be configured on the determination processing portion, and
   wherein at least one of the standard number of times and the threshold is changed according to the operation mode configured on the determination processing portion.

5. A battery control device according to claim 1,
   wherein the acquisition portion acquires at least the temperature of the battery as the measured value, and
   wherein at least one of the standard number of times and the threshold is changed according to the temperature of the battery.

* * * * *